United States Patent
Hsu et al.

(10) Patent No.: US 11,677,433 B2
(45) Date of Patent: Jun. 13, 2023

(54) WIRELESS SYSTEM HAVING LOCAL OSCILLATOR SIGNAL DERIVED FROM REFERENCE CLOCK OUTPUT OF ACTIVE OSCILLATOR THAT HAS NO ELECTROMECHANICAL RESONATOR

(71) Applicant: MEDIATEK INC., Hsin-Chu (TW)

(72) Inventors: Jui-Lin Hsu, Hsinchu (TW); Chao-Ching Hung, Hsinchu (TW); Tzu-Chin Lin, Hsinchu (TW); Wei-Hsiu Hsu, Hsinchu (TW); Yu-Li Hsueh, Hsinchu (TW); Jing-Hong Conan Zhan, Hsinchu (TW); Chih-Ming Hung, San Jose, CA (US)

(73) Assignee: MediaTek Inc., Hsin-Chu (TW)

(*) Notice: Subject to any disclaimer, the term of this patent is extended or adjusted under 35 U.S.C. 154(b) by 617 days.

(21) Appl. No.: 16/152,391

(22) Filed: Oct. 4, 2018

(65) Prior Publication Data
US 2019/0207640 A1 Jul. 4, 2019

Related U.S. Application Data

(60) Provisional application No. 62/613,441, filed on Jan. 4, 2018, provisional application No. 62/655,325, filed on Apr. 10, 2018.

(51) Int. Cl.
*H04B 1/26* (2006.01)
*H04B 15/00* (2006.01)
(Continued)

(52) U.S. Cl.
CPC ............... *H04B 1/403* (2013.01); *G01S 7/03* (2013.01); *G01S 7/032* (2013.01); *H03B 5/12* (2013.01);
(Continued)

(58) Field of Classification Search
None
See application file for complete search history.

(56) References Cited

U.S. PATENT DOCUMENTS 6,593,826 B2 * 7/2003 See .................. H03J 5/244
                                                  331/117 R
7,002,511 B1    2/2006 Ammar
(Continued)

FOREIGN PATENT DOCUMENTS

CN    103455085 A    12/2013
CN    103490774 A    1/2014
(Continued)

OTHER PUBLICATIONS

McCorquodale, "A 0.5-to-480MHz Self-Referenced CMOS Clock Generator with 90ppm Total Frequency Error and Spread-Spectrum Capability", ISSCC 2008/Session 19/PLLs & Oscillators/19.6, pp. 350-351 and 619.

(Continued)

*Primary Examiner* — Tuan A Tran
(74) *Attorney, Agent, or Firm* — Wolf, Greenfield & Sacks, P.C.

(57) ABSTRACT

A wireless system includes an active oscillator and a front-end circuit. The active oscillator is used to generate and output a reference clock. The active oscillator includes at least one active component, and does not include an electromechanical resonator. The front-end circuit is used to process a transmit (TX) signal or a receive (RX) signal according to a local oscillator (LO) signal. The LO signal is derived from the reference clock.

21 Claims, 8 Drawing Sheets

(51) Int. Cl.
*H04B 1/403* (2015.01)
*G01S 7/03* (2006.01)
*H03B 5/12* (2006.01)
*H03K 5/135* (2006.01)
*H04B 7/26* (2006.01)

(52) U.S. Cl.
CPC ........... *H03K 5/135* (2013.01); *H04B 7/2662* (2013.01); *H03B 2200/008* (2013.01)

(56) References Cited

U.S. PATENT DOCUMENTS

| | | | |
|---|---|---|---|
| 7,109,803 B2* | 9/2006 | Rebel | H03L 7/07 331/2 |
| 7,280,001 B2* | 10/2007 | Maligeorgos | H03B 5/366 331/116 FE |
| 7,536,164 B2* | 5/2009 | Maligeorgos | H03L 7/00 331/16 |
| 7,542,445 B2* | 6/2009 | Berggren | H03L 1/025 370/328 |
| 8,890,591 B1 | 11/2014 | Xiu | |
| 9,853,648 B2 | 12/2017 | Su | |
| 2004/0147238 A1 | 7/2004 | Wang et al. | |
| 2006/0068744 A1* | 3/2006 | Maligeorgos | H03L 7/00 455/318 |
| 2009/0278617 A1 | 11/2009 | Lee et al. | |
| 2010/0231452 A1 | 9/2010 | Babakhani et al. | |
| 2012/0295557 A1* | 11/2012 | Brunel | H04B 15/02 455/78 |
| 2016/0126964 A1 | 5/2016 | Huang et al. | |
| 2019/0181902 A1* | 6/2019 | Kollmann | H04B 1/3822 |

FOREIGN PATENT DOCUMENTS

| | | |
|---|---|---|
| EP | 3220542 A1 | 9/2017 |
| WO | WO 2006/039543 A1 | 4/2006 |
| WO | WO 2009/019639 A2 | 2/2009 |
| WO | WO 2011/092003 A1 | 8/2011 |
| WO | WO 2016/054291 A1 | 4/2016 |

OTHER PUBLICATIONS

Partial European Search Report dated Apr. 8, 2019 in connection with European Application No. 18202444.8.
Extended European Search Report dated Jul. 16, 2019 in connection with European Application No. 18202444.8.

* cited by examiner

US 11,677,433 B2

WIRELESS SYSTEM HAVING LOCAL OSCILLATOR SIGNAL DERIVED FROM REFERENCE CLOCK OUTPUT OF ACTIVE OSCILLATOR THAT HAS NO ELECTROMECHANICAL RESONATOR

CROSS REFERENCE TO RELATED APPLICATIONS

This application claims the benefit of U.S. provisional application No. 62/613,441 filed Jan. 4, 2018 and U.S. provisional application No. 62/655,325 filed Apr. 10, 2018. The entire contents of the related applications, including U.S. provisional application No. 62/613,441 and U.S. provisional application No. 62/655,325, are incorporated herein by reference.

BACKGROUND

The present invention relates to wireless communications, and more particularly, to a wireless system that uses a local oscillator signal derived from a reference clock output of an active oscillator that has no electromechanical resonator (e.g., crystal).

A transmit (TX) circuit in a wireless system chip is used to perform an up-conversion process that converts a TX signal from a lower frequency to a higher frequency for signal transmission. A receive (RX) circuit in the wireless system chip is used to perform a down-conversion process that converts an RX signal from a higher frequency to a lower frequency for signal reception. Further, each of the up-conversion process and the down-conversion process requires a local oscillator (LO) signal with a proper LO frequency setting. Typically, the LO signal is derived from a reference clock that is supplied from an off-chip oscillator. For example, the off-chip oscillator is a passive oscillator (e.g., a typical crystal oscillator (XO)). When the wireless system chip is used by an application device, the off-chip oscillator is also used by the application device due to the fact that the reference clock needed by the wireless system chip is supplied from the off-chip oscillator (e.g., XO). If the off-chip oscillator can be omitted, the BOM (bill of material) cost and the PCB (printed circuit board) area of the application device can be reduced.

SUMMARY

One of the objectives of the claimed invention is to provide a wireless system that uses a local oscillator signal derived from a reference clock output of an active oscillator that has no electromechanical resonator (e.g., crystal).

According to a first aspect of the present invention, an exemplary wireless system is disclosed. The exemplary wireless system includes an active oscillator and a front-end circuit. The active oscillator is arranged to generate and output a reference clock. The active oscillator comprises at least one active component, and does not include an electromechanical resonator. The front-end circuit is arranged to process a transmit (TX) signal or a receive (RX) signal according to a local oscillator (LO) signal, wherein the LO signal is derived from the reference clock.

According to a second aspect of the present invention, an exemplary wireless system implemented on a chip is disclosed. The exemplary wireless system includes an on-chip oscillator and a front-end circuit. The on-chip oscillator is arranged to generate and output a reference clock. The front-end circuit is arranged to process a transmit (TX) signal or a receive (RX) signal according to a local oscillator (LO) signal, wherein the LO signal is derived from the reference clock. The chip is not coupled to an off-chip oscillator when the wireless system is in operation.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The present invention proposes a crystal-less (XOless) technique for a wireless system. For example, the XOless technique may be integrated in a wireless system chip. Since an off-chip oscillator such as a crystal oscillator (XO) is not needed by the proposed wireless system chip, a BOM cost of an application device using the proposed wireless system chip can be reduced. Further details of the XOless technique are described with reference to the accompanying drawings.

Figure 1:
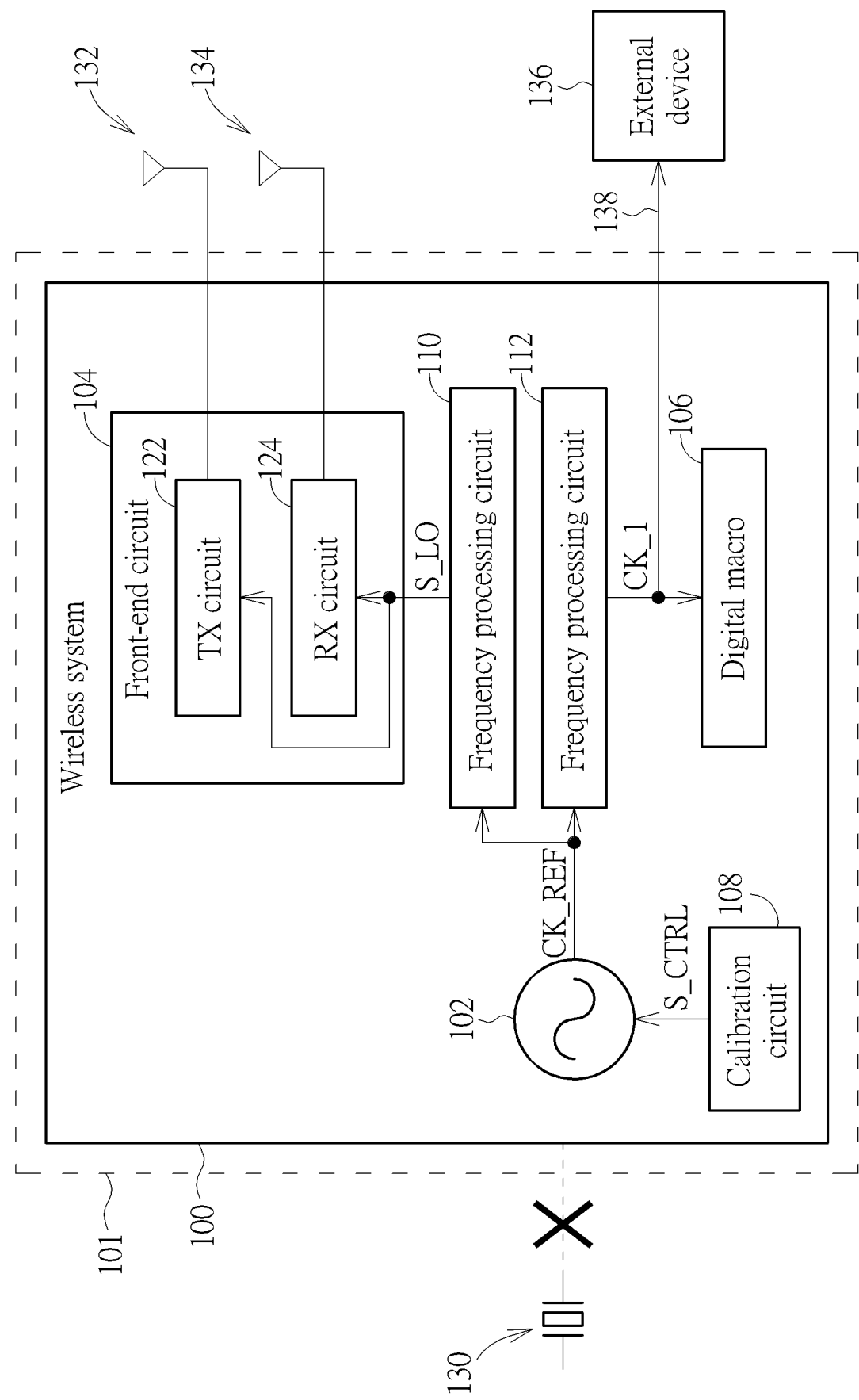
FIG. 1 is a diagram illustrating a first wireless system according to an embodiment of the present invention.

FIG. 1 is a diagram illustrating a first wireless system according to an embodiment of the present invention. For example, the wireless system 100 may be a Radio Detection and Ranging (radar) system. For another example, the wireless system 100 may be a wireless communications system such as a Wi-Fi system. In this embodiment, the wireless system 100 is implemented on a chip 101, and therefore has a plurality of on-chip components including an active oscillator 102, a front-end circuit 104, a digital macro 106, a calibration circuit 108, and a plurality of frequency processing circuits 110 and 112. The active oscillator 102 includes at least one active component (e.g., transistor(s) and/or amplifier(s)), and does not include an electromechanical resonator such as a crystal, a bulk acoustic wave (BAW) resonator, or a microelectromechanical system (MEMS) resonator. That is, the active oscillator 102 is an electromechanical-resonator-less oscillator (e.g., a crystal-less oscillator), and does not consist of passive components (e.g., inductor(s), resistor(s), and/or capacitor(s)) only. For example, the active oscillator 102 may be an LC oscillator having an amplifier circuit and an LC frequency-selective network, where the LC frequency-selective network consists of on-chip passive components only, and is used to create a resonator needed for reference clock generation. For another example, the active oscillator 102 may be an RC oscillator having an amplifier circuit and an RC frequency-selective network, where the RC frequency-selective network consists of on-chip passive components only, and is used to create a resonator needed for reference clock generation. In this embodiment, the active oscillator 102 is anon-chip oscillator circuit arranged to generate and output a reference clock CK_REF.

In this embodiment, pin(s) of the chip 101 are not coupled to an off-chip oscillator 130 when the wireless system 100 is in operation. For example, the off-chip oscillator 130 is a crystal oscillator which uses the mechanical resonance of a vibrating crystal of piezoelectric material to create an electrical signal with a precise frequency. In other words, a normal operation of the wireless system 100 can be achieved with the reference clock CK_REF provided by the on-chip oscillator (i.e., active oscillator 102), and does not require a reference clock supplied from the off-chip oscillator 130 such as a typical crystal oscillator. The off-chip oscillator 130 can be omitted in an application device when the proposed wireless system 100 is used by the application device. In this way, the BOM cost of the application device using the proposed wireless system 100 can be reduced.

The reference clock CK_REF may act as a system clock of the wireless system 100. Hence, the reference clock CK_REF generated from the active oscillator 102 can be used to create periodical signals needed by normal operations of other on-chip components, including the front-end circuit 104, the digital macro 106, etc.

The front-end circuit 104 is arranged to process a transmit (TX) signal and/or a receive (RX) signal according to a local oscillator (LO) signal S_LO. In this embodiment, the front-end circuit 104 is a transceiver circuit having a TX circuit 122 and an RX circuit 124, where the TX circuit 122 is coupled to an off-chip TX antenna 132, and the RX circuit 134 is coupled to an off-chip RX antenna 134. The TX circuit 122 is used to perform an up-conversion process that converts the TX signal from a lower frequency to a higher frequency for signal transmission via the TX antenna 132. The RX circuit 124 is used to receive the RX signal from the RX antenna 134, and perform a down-conversion process that converts the RX signal from a higher frequency to a lower frequency for signal reception. An LO frequency of the LO signal S_LO should be properly set to meet requirements of the up-conversion process and the down-conversion process. For example, the LO frequency may be set by a frequency value at a millimeter wave (mmWave) band, lower than the mmWave band, or higher than the mmWave band, depending upon the actual design considerations. In a case where the wireless system 100 is a radar system (e.g., an automotive radar system), the LO signal S_LO may have the LO frequency at a 3.1-10.6 GHz band, 24 GHz, 60 GHz, a 76-77 GHz band, or a 77-81 GHz band. However, this is for illustrative purposes only, and is not meant to be a limitation of the present invention.

As shown in FIG. 1, one frequency processing circuit 110 is arranged to receive the reference clock CK_REF with a reference frequency different from the LO frequency, generate the LO signal S_LO with the LO frequency according to the reference clock CK_REF, and output the LO signal S_LO to the front-end circuit 104 (particularly, TX circuit 122 and RX circuit 124). For example, the frequency processing circuit 110 may include a phase-locked loop (PLL) circuit, a frequency multiplier circuit, and/or a frequency divider circuit, depending upon the discrepancy between the LO frequency of the LO signal S_LO and the reference frequency of the reference clock CK_REF.

The digital macro 106 is arranged to perform at least one data processing function according to a first clock CK_1 with a first frequency. For example, the digital macro 106 may have a digital circuit such as an on-chip central processing unit (CPU) or an on-chip radar signal processor (RSP). As shown in FIG. 1, another frequency processing circuit 112 is arranged to receive the reference clock CK_REF with the reference frequency different from the first frequency, generate the first clock CK_1 with the first frequency according to the reference clock CK_REF, and output the first clock CK_1 to the digital macro 106. For example, the frequency processing circuit 112 may include a PLL circuit, a frequency multiplier circuit, and/or a frequency divider circuit, depending upon the discrepancy between the first frequency of the first clock CK_1 and the reference frequency of the reference clock CK_REF.

Moreover, the first clock CK_1 generated from the frequency processing circuit 112 may be output to an external device 136 that is located outside of the chip 101. The external device 136 is coupled to the chip 101 via an interface 138 such as a UART (universal asynchronous receiver/transmitter) interface, an OWI (one-wire communication interface), a 3-wire interface, an SPI (serial peripheral interface), an LIN (local interconnect network) bus, or a CAN (controller area network) bus. In other words, the on-chip digital macro 106 and the external device 136 can share the same first clock CK_1 output from the frequency processing circuit 112. For example, the external device 136 may be a digital signal processor (DSP) device or a Flash memory device.

Compared to a reference clock generated from an off-chip crystal oscillator, a reference clock generated from an on-chip active oscillator may have less stability and accuracy. In this embodiment, the calibration circuit 108 is arranged to control the active oscillator 102 for calibrating the reference frequency of the reference clock CK_REF. The active oscillator 102 changes the reference frequency of the reference clock CK_REF in response to a control signal S_CTRL generated from the calibration circuit 108. For example, the calibration circuit 108 is a self-calibration circuit that applies frequency calibration to the active oscillator 102 in response to frequency drift resulting from temperature variation.

It should be noted that the calibration circuit 108 may be an optional component. Hence, the calibration circuit 108 may be omitted in some embodiments of the present invention. In practice, any wireless system (e.g., wireless system chip) using an active oscillator (e.g., on-chip active oscillator) with/without frequency calibration falls within the scope of the present invention.

In the embodiment shown in FIG. 1, the reference frequency of the reference clock CK_REF generated from the active oscillator 102 is different from (e.g., higher than or lower than) the LO frequency needed by the front-end circuit 104. Hence, the frequency processing circuit 110 is implemented to process the reference clock CK_REF for creating the LO signal S_LO with the needed LO frequency. However, this is for illustrative purposes only, and is not meant to be a limitation of the present invention. In an alternative design, the frequency processing circuit 110 can be omitted when the reference frequency of the reference clock CK_REF generated from the active oscillator 102 is equal to the LO frequency needed by the front-end circuit 104.

Figure 2:
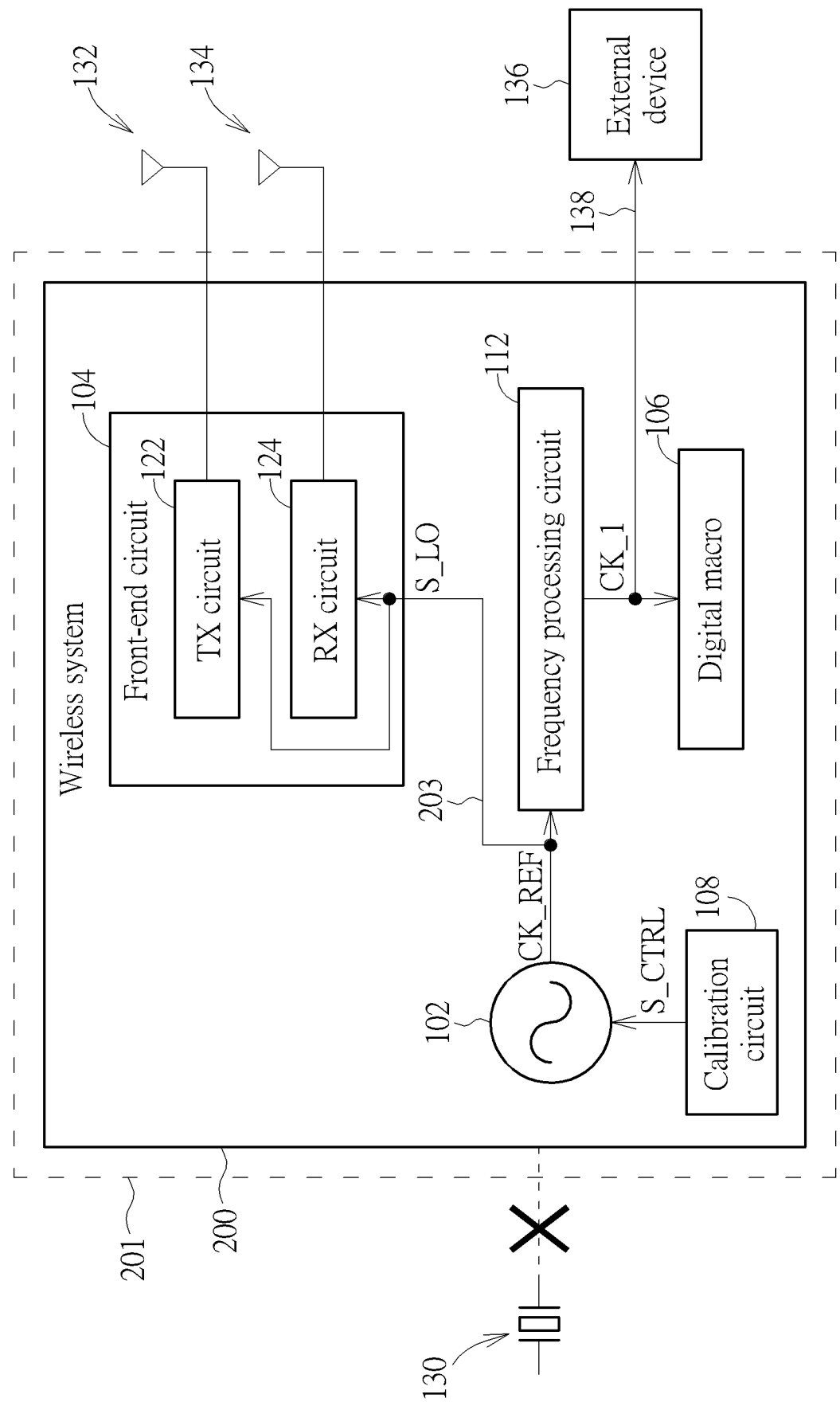
FIG. 2 is a diagram illustrating a second wireless system according to an embodiment of the present invention.

FIG. 2 is a diagram illustrating a second wireless system according to an embodiment of the present invention. For example, the wireless system 200 may be a radar system such as an automotive radar system. For another example, the wireless system 200 may be a wireless communication system such as a Wi-Fi system. In this embodiment, the wireless system 200 is implemented on a chip 201, and therefore has a plurality of on-chip components. The major difference between the wireless systems 100 and 200 is that the wireless system. 200 has a direct path 203 connected between an output port of the active oscillator 102 and an input port of the front-end circuit 104. Hence, the reference clock CK_REF with a reference frequency equal to an LO frequency is supplied to the front-end circuit 104 via the direct path 203, such that the reference clock CK_REF received by the front-end circuit 104 acts as the LO signal S_LO directly.

In the embodiment shown in FIG. 1, the reference frequency of the reference clock CK_REF generated from the active oscillator 102 is different from (e.g., higher than or lower than) the clock frequency needed by both of the digital macro 106 and the external device 136. Hence, the frequency processing circuit 112 is implemented to process the reference clock CK_REF for creating the first clock CK_1 with the needed first frequency, where the same first clock CK_1 is shared by the on-chip digital macro 106 and the external device 136. However, this is for illustrative purposes only, and is not meant to be a limitation of the present invention. In an alternative design, the clock frequency needed by the digital macro 106 and the clock frequency needed by the external device 136 are not necessarily the same. When the clock frequency needed by the digital macro 106 is different from (e.g., higher than or lower than) the clock frequency needed by the external device 136, multiple frequency processing circuits may be used in a wireless system.

Figure 3:
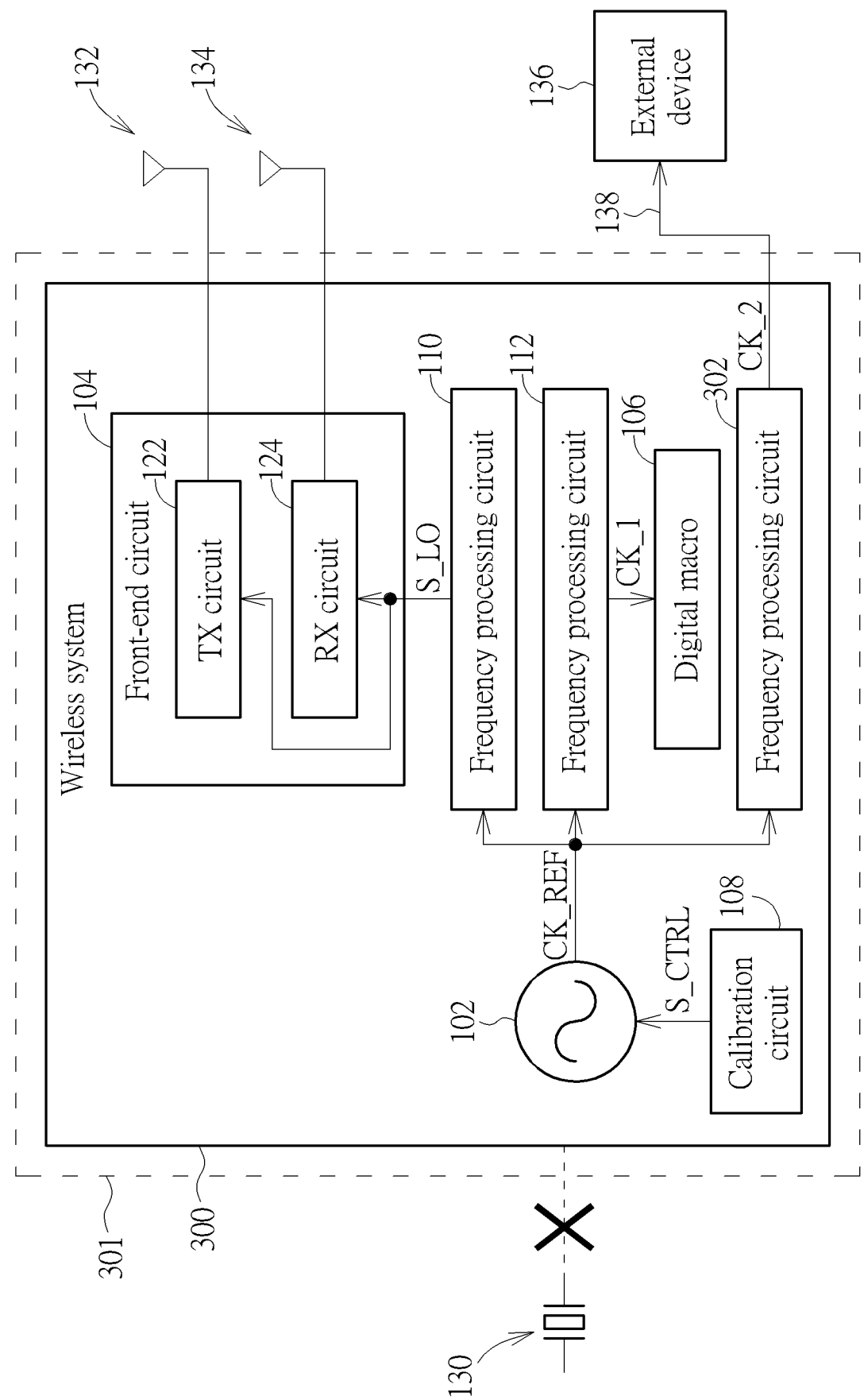
FIG. 3 is a diagram illustrating a third wireless system according to an embodiment of the present invention.

FIG. 3 is a diagram illustrating a third wireless system according to an embodiment of the present invention. For example, the wireless system 300 may be a radar system such as an automotive radar system. For another example, the wireless system 300 may be a wireless communication system such as a Wi-Fi system. In this embodiment, the wireless system 300 is implemented on a chip 301, and therefore has a plurality of on-chip components. The major difference between the wireless systems 100 and 300 is that the wireless system 300 further includes a frequency processing circuit 302, and the first clock CK_1 is not output to the external device 136.

The frequency processing circuit 302 is arranged to receive the reference clock CK_REF with the reference frequency different from a second frequency (which may be different from the first frequency of the first clock CK_1), generate a second clock CK_2 with the second frequency according to the reference clock CK_REF, and output the second clock CK_2 to the external device 136 via the interface 138. For example, the frequency processing circuit 302 may include a PLL circuit, a frequency multiplier circuit, and/or a frequency divider circuit, depending upon the discrepancy between the second frequency of the second clock CK_2 and the reference frequency of the reference clock CK_REF.

In the embodiment shown in FIG. 3, the reference frequency of the reference clock CK_REF generated from the active oscillator 102 is different from (e.g., higher than or lower than) the LO frequency needed by the front-end circuit 104. Hence, the frequency processing circuit 110 is implemented to process the reference clock CK_REF for creating the LO signal S_LO with the needed LO frequency. However, this is for illustrative purposes only, and is not meant to be a limitation of the present invention. In an alternative design, the frequency processing circuit 110 can be omitted when the reference frequency of the reference clock CK_REF generated from the active oscillator 102 is equal to the LO frequency needed by the front-end circuit 104.

Figure 4:
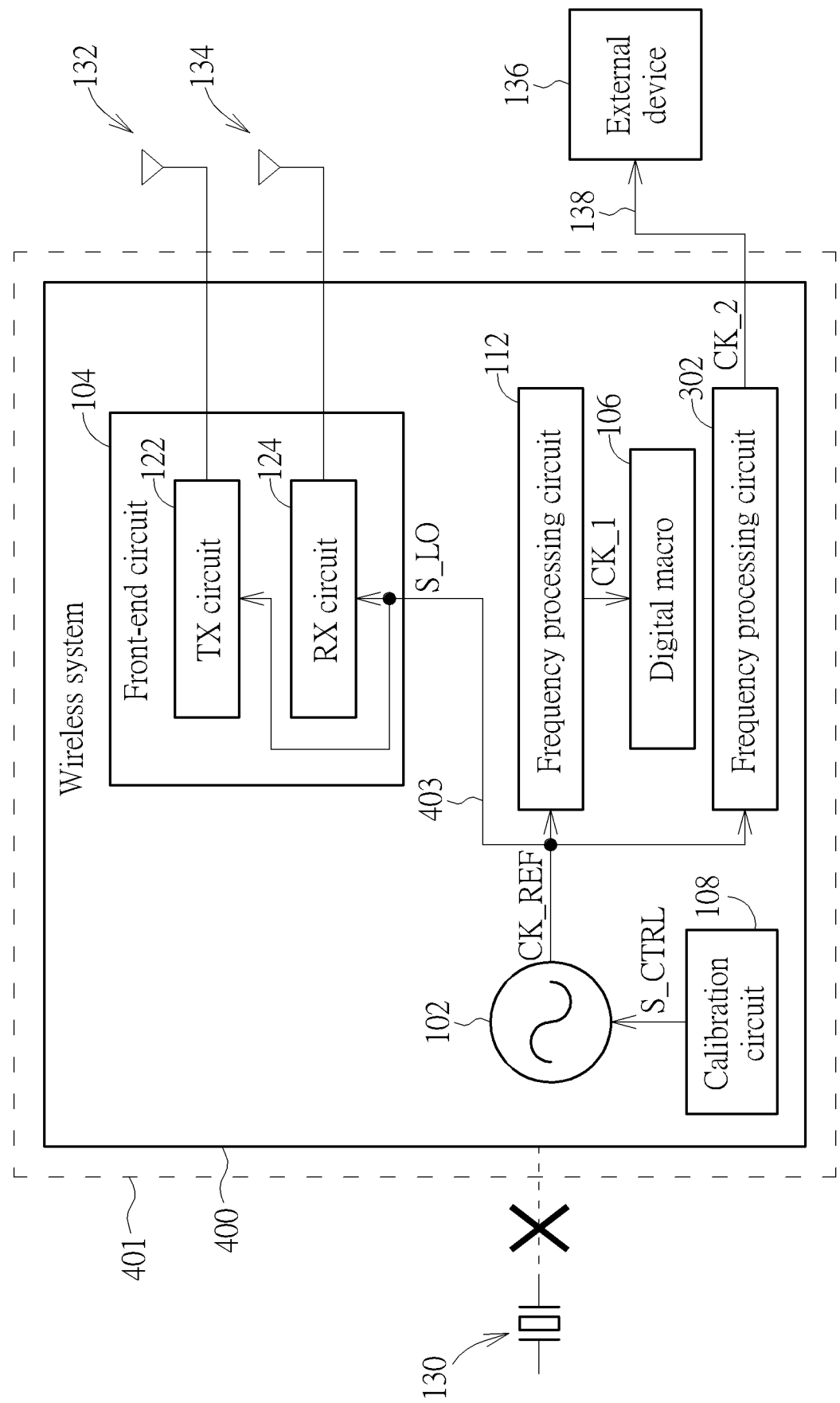
FIG. 4 is a diagram illustrating a fourth wireless system according to an embodiment of the present invention.

FIG. 4 is a diagram illustrating a fourth wireless system according to an embodiment of the present invention. For example, the wireless system 400 may be a radar system such as an automotive radar system. For another example, the wireless system 400 may be a wireless communication system such as a Wi-Fi system. In this embodiment, the wireless system 400 is implemented on a chip 401, and therefore has a plurality of on-chip components. The major difference between the wireless systems 300 and 400 is that the wireless system. 400 has a direct path 403 connected between an output port of the active oscillator 102 and an input port of the front-end circuit 104. Hence, the reference clock CK_REF with a reference frequency equal to an LO frequency is supplied to the front-end circuit 104 via the direct path 403, such that the reference clock CK_REF received by the front-end circuit 104 acts as the LO signal S_LO directly.

In some embodiments of the present invention, the frequency processing circuit 110 used in the wireless system 100/300 may be modified to generate a range of frequencies according to the reference frequency of the reference clock CK_REF and then select one frequency from the range of frequencies as the LO frequency. Selecting an accurate frequency from the range of frequencies can compensate for the drift of the reference frequency, either before or after the frequency calibration of the active oscillator 102. In this way, the frequency regulation can be met.

As mentioned above, the calibration circuit 108 may be a self-calibration circuit that applies frequency calibration to the active oscillator 102. However, this is for illustrative purposes only, and is not meant to be a limitation of the present invention. Alternatively, the frequency calibration of the active oscillator 102 may be based on an external source.

Figure 5:
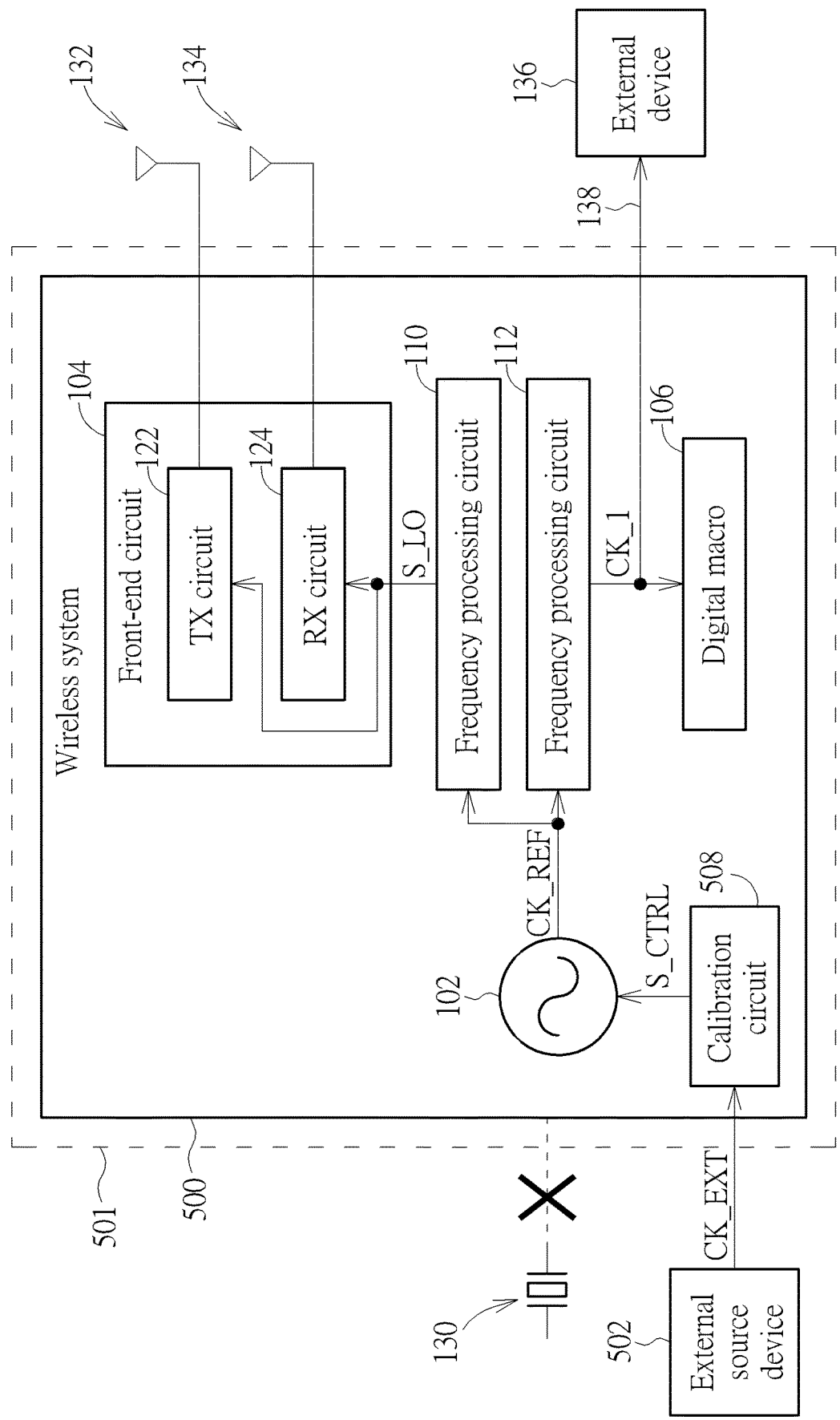
FIG. 5 is a diagram illustrating a fifth wireless system according to an embodiment of the present invention.

FIG. 5 is a diagram illustrating a fifth wireless system according to an embodiment of the present invention. For example, the wireless system 500 may be a radar system such as an automotive radar system. For another example, the wireless system 500 may be a wireless communication system such as a Wi-Fi system. In this embodiment, the wireless system 500 is implemented on a chip 501, and therefore has a plurality of on-chip components. The major difference between the wireless systems 100 and 500 is that the wireless system 500 has a calibration circuit 508 that is arranged to receive an external reference clock CK_EXT from an external source device 502 located outside of the chip 501 and apply frequency calibration to the active oscillator 102 according to the external reference clock CK_EXT.

Figure 6:
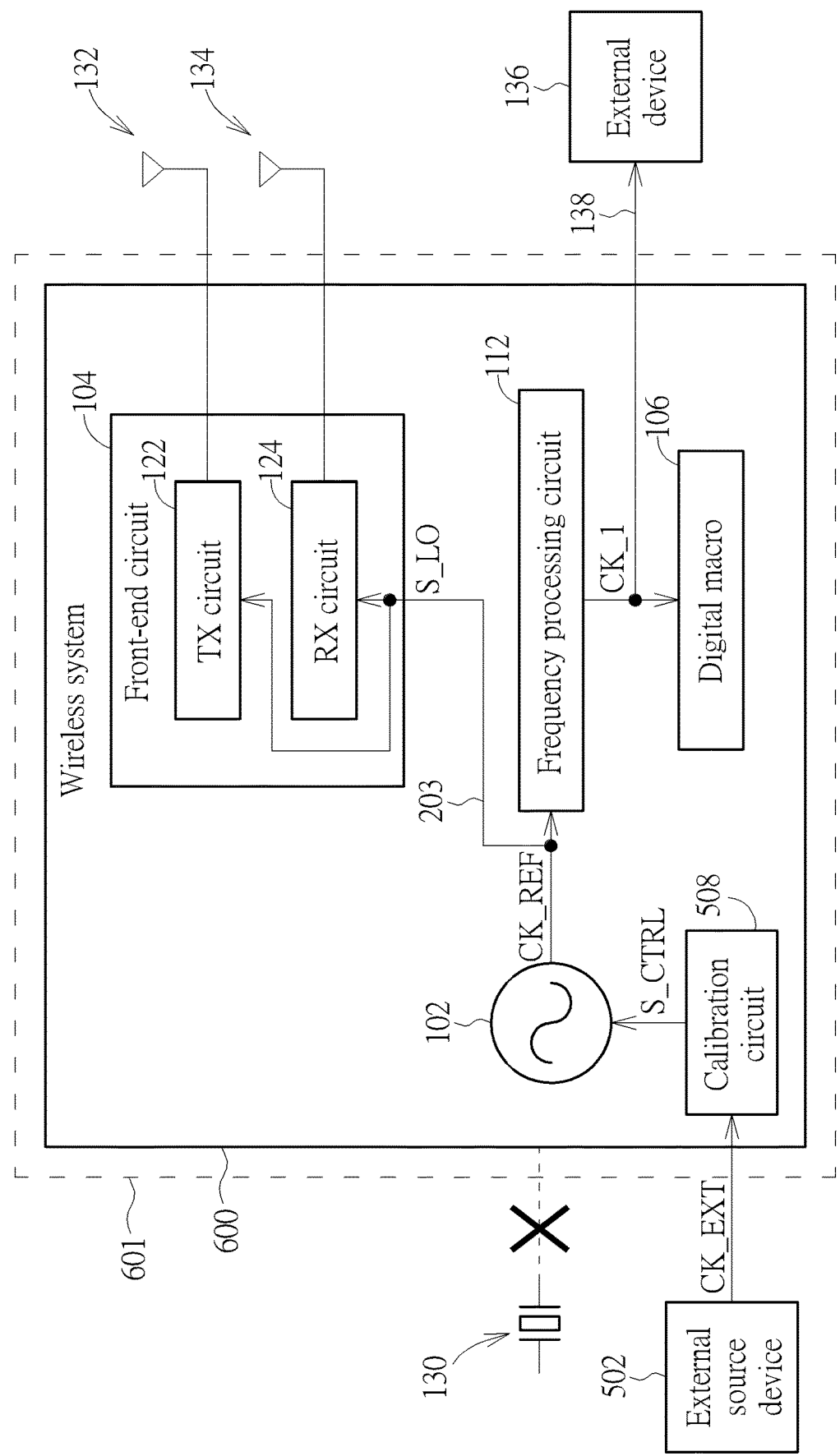
FIG. 6 is a diagram illustrating a sixth wireless system according to an embodiment of the present invention.

FIG. 6 is a diagram illustrating a sixth wireless system according to an embodiment of the present invention. For example, the wireless system 600 may be a radar system such as an automotive radar system. For another example, the wireless system 600 may be a wireless communication system such as a Wi-Fi system. In this embodiment, the wireless system 600 is implemented on a chip 601, and therefore has a plurality of on-chip components. The major difference between the wireless systems 200 and 600 is that the wireless system 600 has the calibration circuit 508 that is arranged to receive the external reference clock CK_EXT from the external source device 502 located outside of the chip 601 and apply frequency calibration to the active oscillator 102 according to the external reference clock CK_EXT.

Figure 7:
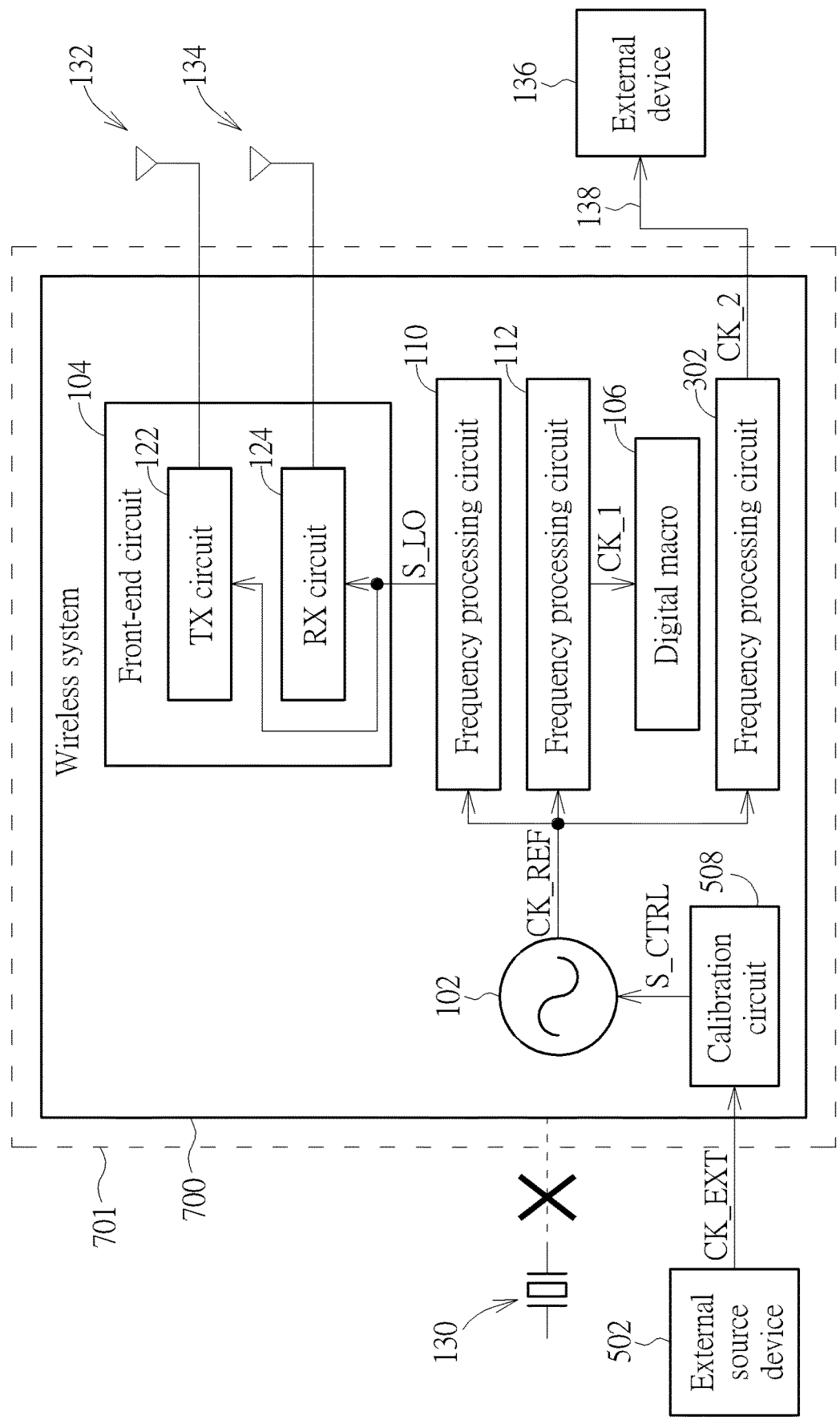
FIG. 7 is a diagram illustrating a seventh wireless system according to an embodiment of the present invention.

FIG. 7 is a diagram illustrating a seventh wireless system according to an embodiment of the present invention. For example, the wireless system 700 may be a radar system such as an automotive radar system. For another example, the wireless system 700 may be a wireless communication system such as a Wi-Fi system. In this embodiment, the wireless system 700 is implemented on a chip 701, and therefore has a plurality of on-chip components. The major difference between the wireless systems 300 and 700 is that the wireless system 700 has the calibration circuit 508 that is arranged to receive the external reference clock CK_EXT from the external source device 502 located outside of the chip 701 and apply frequency calibration to the active oscillator 102 according to the external reference clock CK_EXT.

Figure 8:
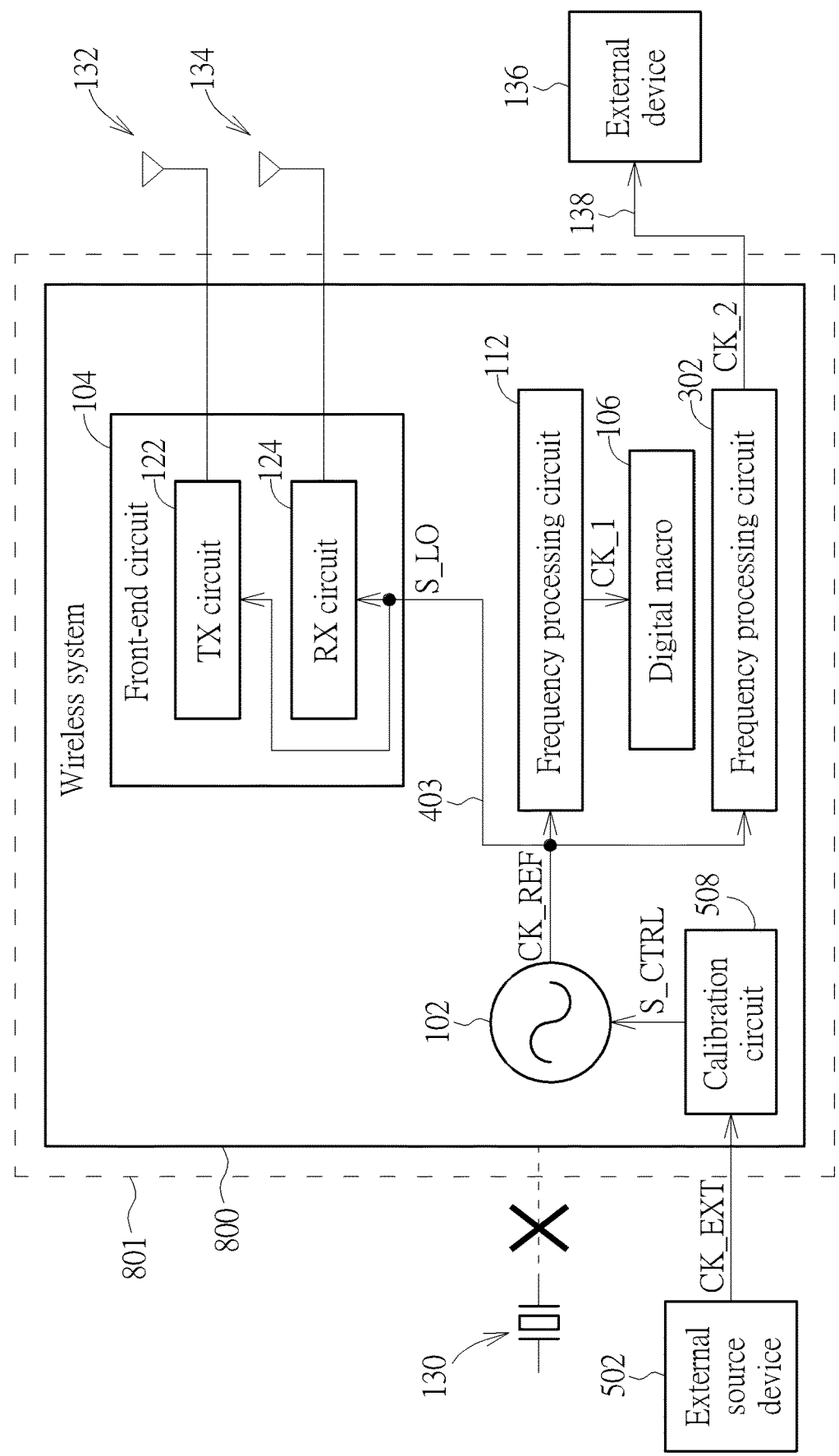
FIG. 8 is a diagram illustrating an eighth wireless system according to an embodiment of the present invention.

FIG. 8 is a diagram illustrating an eighth wireless system according to an embodiment of the present invention. For example, the wireless system 800 may be a radar system such as an automotive radar system. For another example, the wireless system 800 may be a wireless communication system such as a Wi-Fi system. In this embodiment, the wireless system 800 is implemented on a chip 801, and therefore has a plurality of on-chip components. The major difference between the wireless systems 400 and 800 is that the wireless system 800 has the calibration circuit 508 that is arranged to receive the external reference clock CK_EXT from the external source device 502 located outside of the chip 801 and apply frequency calibration to the active oscillator 102 according to the external reference clock CK_EXT.

For example, when the wireless system 500/600/700/800 is an automotive radar system, the external source device 502 may be an electronic control unit (ECU). Hence, the calibration circuit 508 may receive an ECU reference clock from a defined interface, and may apply frequency calibration to the active oscillator 102 according to the ECU reference clock, where the frequency calibration may be real-time calibration or power-on calibration. In this way, clock alignment with the external ECU located outside of the chip 501/601/701/801 can be achieved. For another example, the external reference clock CK_EXT needed by frequency calibration of the active oscillator 102 may be extracted from a radio-frequency (RF) signal and then supplied by the external source device 502.

It should be noted that the calibration circuit 508 may be an optional component. Hence, the calibration circuit 508 may be omitted in some embodiments of the present invention. In practice, any wireless system (e.g., wireless system chip) using an active oscillator (e.g., on-chip active oscillator) with/without frequency calibration falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wireless system comprising:
an active oscillator, arranged to generate and output a reference clock, wherein the active oscillator comprises at least one active component, and does not include an electromechanical resonator; and
a front-end circuit, arranged to process a transmit (TX) signal or a receive (RX) signal according to a local oscillator (LO) signal, wherein the LO signal is derived from the reference clock.

2. The wireless system of claim 1, wherein the wireless system is a Radio Detection and Ranging (radar) system.

3. The wireless system of claim 1, wherein the LO signal has an LO frequency at a 3.1-10.6 GHz band, 24 GHz, 60 GHz, a 76-77 GHz band, or a 77-81 GHz band.

4. The wireless system of claim 1, wherein the wireless system is implemented on a chip, and the active oscillator is an on-chip oscillator.

5. The wireless system of claim 1, wherein the reference clock with an LO frequency is supplied to the front-end circuit, and the reference clock received by the front-end circuit acts as the LO signal directly.

6. The wireless system of claim 1, further comprising:
a frequency processing circuit, arranged to receive the reference clock with a reference frequency different from an LO frequency, generate the LO signal with the LO frequency according to the reference clock, and output the LO signal to the front-end circuit.

7. The wireless system of claim 1, further comprising:
a digital circuit, arranged to perform at least one data processing function according to a clock with a specific frequency; and
a frequency processing circuit, arranged to receive the reference clock with a reference frequency different from the specific frequency, generate the clock with the specific frequency according to the reference clock, and output the clock to the digital circuit.

8. The wireless system of claim 7, wherein the wireless system is implemented on a chip, and the frequency processing circuit is further arranged to output the clock with the specific frequency to an external device that is located outside of the chip.

9. The wireless system of claim 1, wherein the wireless system is implemented on a chip, and further comprises:
a frequency processing circuit, arranged to receive the reference clock with a reference frequency different from a specific frequency, generate a clock with the specific frequency according to the reference clock, and output the clock to an external device that is located outside of the chip.

10. The wireless system of claim 1, further comprising:
a calibration circuit, arranged to control the active oscillator for calibrating a reference frequency of the reference clock.

11. The wireless system of claim 10, wherein the wireless system is implemented on a chip, and the calibration circuit is arranged to receive an external reference clock from an external source device located outside of the chip, and calibrate the reference frequency of the reference clock according to the external reference clock.

12. A wireless system implemented on a chip, comprising:
an on-chip oscillator, arranged to generate and output a reference clock, wherein the on-chip oscillator is an active oscillator having at least one active component, and does not include an electromechanical resonator; and a front-end circuit, arranged to process a transmit (TX) signal or a receive (RX) signal according to a local oscillator (LO) signal, wherein the LO signal is derived from the reference clock;

wherein the chip is not coupled to an off-chip oscillator when the wireless system is in operation.

13. The wireless system of claim 12, wherein the wireless system is a Radio Detection and Ranging (radar) system.

14. The wireless system of claim 12, wherein the LO signal has an LO frequency at a 3.1-10.6 GHz band, 24 GHz, 60 GHz, a 76-77 GHz band, or a 77-81 GHz band.

15. The wireless system of claim 12, wherein the reference clock with an LO frequency is supplied to the front-end circuit, and the reference clock received by the front-end circuit acts as the LO signal directly.

16. The wireless system of claim 12, further comprising:
a frequency processing circuit, arranged to receive the reference clock with a reference frequency different from an LO frequency, generate the LO signal with the LO frequency according to the reference clock, and output the LO signal to the front-end circuit.

17. The wireless system of claim 12, further comprising:
a digital circuit, arranged to perform at least one data processing function according to a clock with a specific frequency; and
a frequency processing circuit, arranged to receive the reference clock with a reference frequency different from the specific frequency, generate the clock with the specific frequency according to the reference clock, and output the clock to the digital circuit.

18. The wireless system of claim 17, wherein the frequency processing circuit is further arranged to output the clock with the specific frequency to an external device that is located outside of the chip.

19. The wireless system of claim 12, further comprising:
a frequency processing circuit, arranged to receive the reference clock with a reference frequency different from a specific frequency, generate a clock with the specific frequency according to the reference clock, and output the clock to an external device that is located outside of the chip.

20. The wireless system of claim 12, further comprising:
a calibration circuit, arranged to control the on-chip oscillator for calibrating a reference frequency of the reference clock.

21. The wireless system of claim 20, wherein the calibration circuit is arranged to receive an external reference clock from an external source device located outside of the chip, and calibrate the reference frequency of the reference clock according to the external reference clock.

\* \* \* \* \*